(12) United States Patent
Kato et al.

(10) Patent No.: US 11,515,504 B2
(45) Date of Patent: Nov. 29, 2022

(54) DISPLAY PANEL AND DISPLAY PANEL MANUFACTURING METHOD

(71) Applicant: JOLED INC., Tokyo (JP)

(72) Inventors: Hiroki Kato, Tokyo (JP); Makoto Noda, Tokyo (JP)

(73) Assignee: JOLED INC., Tokyo (JP)

( * ) Notice: Subject to any disclaimer, the term of this patent is extended or adjusted under 35 U.S.C. 154(b) by 177 days.

(21) Appl. No.: 17/001,026

(22) Filed: Aug. 24, 2020

(65) Prior Publication Data

US 2021/0066647 A1    Mar. 4, 2021

(30) Foreign Application Priority Data

Aug. 26, 2019 (JP) .............................. JP2019-153971

(51) Int. Cl.
*H01L 51/52* (2006.01)
*H01L 51/56* (2006.01)
*H01L 51/00* (2006.01)

(52) U.S. Cl.
CPC ...... *H01L 51/5246* (2013.01); *H01L 51/0097* (2013.01); *H01L 51/5293* (2013.01); *H01L 51/56* (2013.01); *H01L 2251/5338* (2013.01)

(58) Field of Classification Search
None
See application file for complete search history.

(56) References Cited

U.S. PATENT DOCUMENTS

2015/0048326 A1    2/2015  Cho et al.
2017/0263806 A1*   9/2017  Yamashita .......... H01L 27/1266

FOREIGN PATENT DOCUMENTS

| JP | 2018-002772 | 1/2018 |
| JP | 2018-095724 | 6/2018 |
| JP | 2018-127634 | 8/2018 |
| JP | 2018-203836 | 12/2018 |
| JP | 2019-019336 | 2/2019 |
| JP | 2019-019337 | 2/2019 |
| WO | 2018/221336 | 12/2018 |

* cited by examiner

*Primary Examiner* — Joe E. Schoenholtz
(74) *Attorney, Agent, or Firm* — Greenblum & Bernstein, P.L.C.

(57) ABSTRACT

A display panel including a metal film, an adhesive layer disposed on the metal film, a first resin substrate disposed on the adhesive layer, light-emitting elements disposed above the first resin substrate, and a second resin substrate disposed above the light-emitting elements. The adhesive layer includes contact portions in contact with the metal film and gaps are present between the contact portions where the adhesive layer is not in contact with the metal film.

9 Claims, 11 Drawing Sheets

FIG. 1A
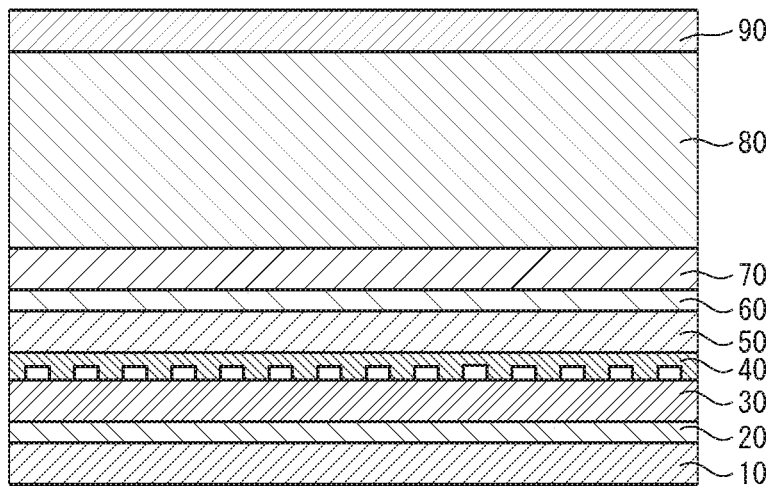
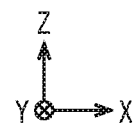
FIG. 1B
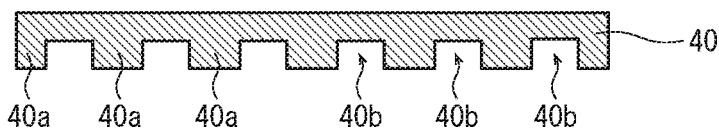
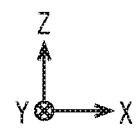
FIG. 1C
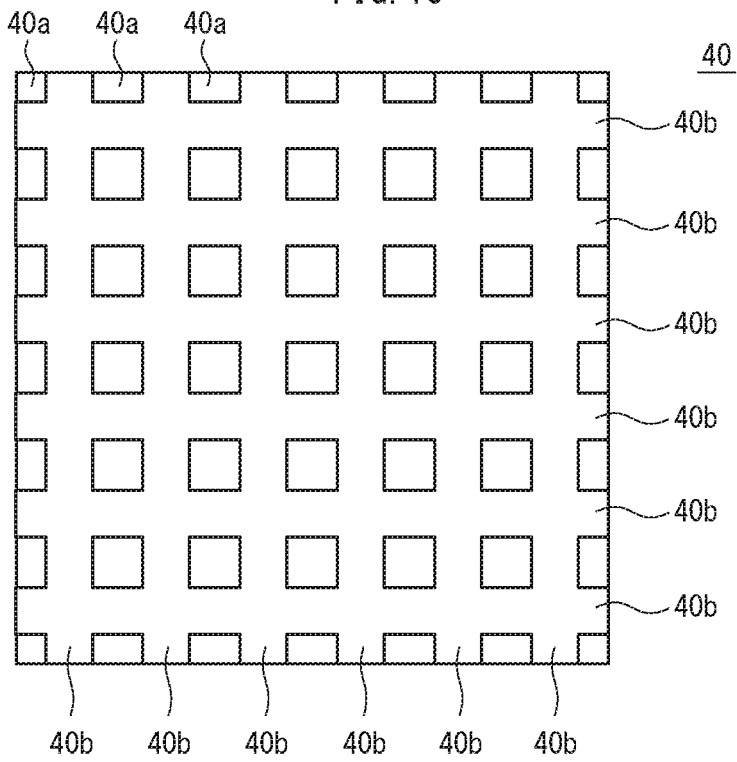
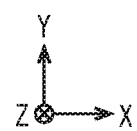

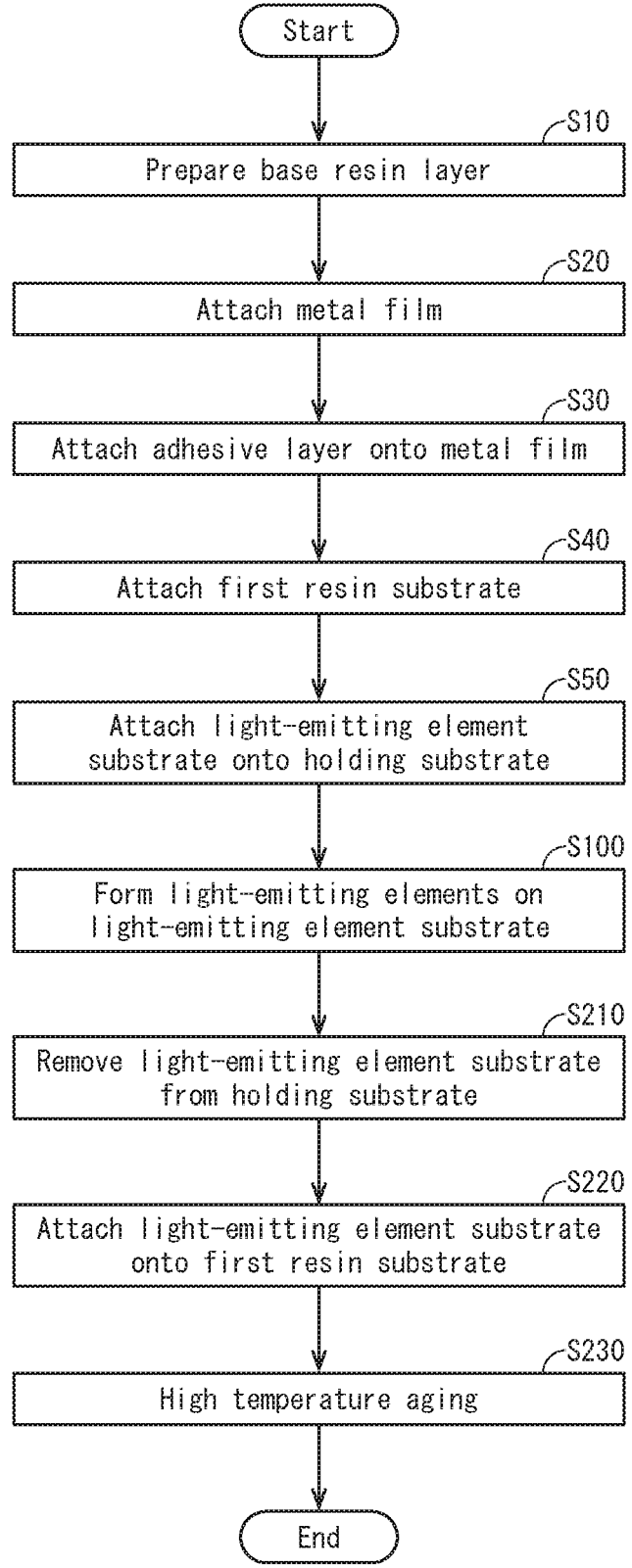

DISPLAY PANEL AND DISPLAY PANEL MANUFACTURING METHOD

This application claims priority to Japanese Patent Application No. 2019-153971, filed Aug. 26, 2019, the contents of which are hereby incorporated by reference in their entirety.

BACKGROUND

Technical Field

The present disclosure relates to display panels including a plurality of self-luminous elements, and in particular to flexible panel substrate structures.

Description of Related Art

Display panels including a plurality of self-luminous elements, such as organic light emitting diodes (OLED) and quantum dot light emitting diodes (QLED), may be based on known conventional technology. A self-luminous element has a structure in which thin films of various materials are stacked, including a thin film transistor (TFT) substrate covered by a planarizing insulating layer, on which is stacked at least a pixel electrode, a counter electrode, and a light emitting layer between the pixel electrode and the counter electrode.

In recent years, flexible display devices using flexible substrates have been proposed for such display panels. US 2015/0048326 describes an organic electroluminescence (EL) display panel in which a plurality of organic EL elements are arranged on sealing layer above a flexible substrate. When manufacturing such a flexible display panel, it is common for the flexible substrate to be attached to a rigid substrate such as glass, in order to prevent a decrease in alignment accuracy due to stretching, bending, wrinkling, etc., of the flexible substrate.

SUMMARY

The present disclosure describes a display panel that has a laminated structure including a metal film and a resin substrate, the laminated structure suppressing generation of bubbles and warping of the resin substrate due to a high temperature aging treatment.

A display panel according to one aspect of the present disclosure is a display panel including a metal film, an adhesive layer disposed on the metal film, a first resin substrate disposed on the adhesive layer, light-emitting elements disposed above the first resin substrate, and a second resin substrate disposed above the light-emitting elements. The adhesive layer includes contact portions in contact with the metal film and gaps are present between the contact portions where the adhesive layer is not in contact with the metal film.

According to this display panel, there is an outgassing path from the first resin substrate to outside the display panel via the adhesive layer, and therefore an occurrence of an outgassed gas remaining in the first resin substrate and generating bubbles during the high temperature aging treatment can be suppressed. Further, a gap exists between the adhesive layer and the metal film, and therefore stress due to contraction of the first resin substrate due to the high temperature aging treatment can be alleviated and warpage of the display panel can be suppressed.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 1A is a schematic cross-section diagram of an organic EL display panel 1 according to an embodiment. FIG. 1B is a schematic cross-section diagram of a second adhesive layer 40 according to an embodiment. FIG. 1C is a schematic plan view diagram of the second adhesive layer 40 according to an embodiment.

FIG. 4A is a schematic cross-section diagram illustrating a stress state after high temperature aging treatment of the organic EL display panel 1 according to an embodiment, while

FIG. 5 is a flowchart illustrating an organic EL display panel manufacturing process according to an embodiment.

FIG. 6A illustrates a prepared base resin layer, FIG. 6B illustrates the metal film adhered to the base resin layer, FIG. 6C illustrates the second adhesive layer adhered to the metal film, and FIG. 6D illustrates a first resin substrate adhered to the second adhesive layer.

FIG. 7A illustrates a light-emitting element substrate formed on a holding substrate, FIG. 7B illustrates a first sealing layer formed on the light-emitting element substrate, FIG. 7C illustrates a TFT layer and an interlayer insulating layer formed on the first sealing layer, and FIG. 7D illustrates pixel electrodes formed on the interlayer insulating layer.

FIG. 8A illustrates banks formed on the interlayer insulating layer and the pixel electrodes, FIG. 8B illustrates first functional layers formed on the pixel electrodes, and FIG. 8C illustrates light-emitting layers formed on the first functional layers.

FIG. 9A illustrates a second functional layer formed on the light-emitting layers and the banks, FIG. 9B illustrates a counter electrode formed on the second functional layer, and FIG. 9C illustrates a second sealing layer formed on the counter electrode.

FIG. 10A illustrates the polarizing plate adhered to the second sealing layer and FIG. 10B illustrates the light-emitting element substrate adhered to the first resin substrate.

DETAILED DESCRIPTION

Figure 2:
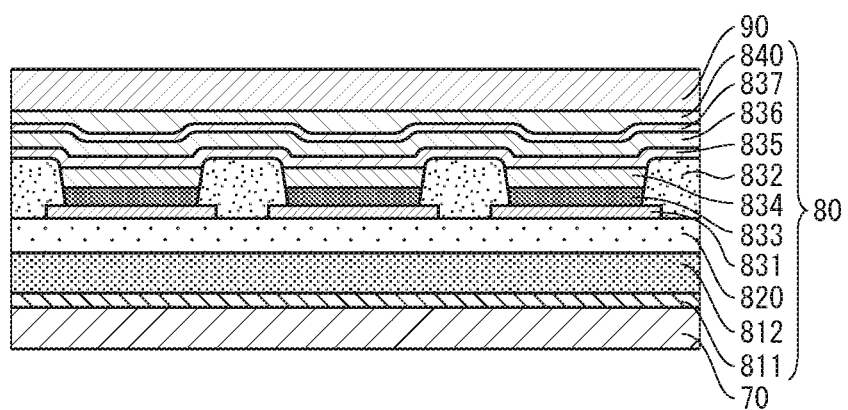
FIG. 2 is a schematic cross-section diagram of a light-emitting element substrate 70, a light-emitting element layer 80, and a polarizing plate 90 according to an embodiment.

A display panel according to one aspect of the present disclosure is a display panel including a metal film, an adhesive layer disposed on the metal film, a first resin substrate disposed on the adhesive layer, light-emitting elements disposed above the first resin substrate, and a second resin substrate disposed above the light-emitting elements. The adhesive layer includes contact portions in contact with the metal film and gaps are present between the contact portions where the adhesive layer is not in contact with the metal film.

According to this display panel, there is an outgassing path from the first resin substrate to outside the display panel via the adhesive layer, and therefore an occurrence of an outgassed gas remaining in the first resin substrate and generating bubbles during the high temperature aging treatment can be suppressed. Further, a gap exists between the adhesive layer and the metal film, and therefore stress due to contraction of the first resin substrate due to the high temperature aging treatment can be alleviated and warpage of the display panel can be suppressed.

According to at least one embodiment, a surface area where the adhesive layer is in contact with the first resin substrate is greater than a total surface area where the contact portions are in contact with the metal film.

According to this structure, an adhesive force between the adhesive layer and the first resin substrate is greater, resulting in a more robust substrate.

According to at least one embodiment, the adhesive layer includes a first adhesive layer in contact with the first resin substrate, and a second adhesive layer composed of the contact portions.

According to this structure, the adhesive layer can be easily formed in advance, and the display panel can be efficiently manufactured.

According to at least one embodiment, the second resin substrate is a polarizing plate.

According to this structure, warpage due to the high temperature aging treatment can be suppressed in a display panel using a polarizing plate for the purpose of suppressing reflection of external light.

According to at least one embodiment, a water absorption rate of a material of the first resin substrate is 0.1% or more.

According to this structure, even when a material having a high water absorption rate and a large shrinkage due to the high temperature aging treatment is used as the first resin substrate, generation of bubbles and warpage can be suppressed.

According to at least one embodiment, the material of the first resin substrate is polyethylene terephthalate (PET).

According to this structure, even when PET, which has a high water absorption rate and a large shrinkage due to the high temperature aging treatment, is used as the material of the first resin substrate, generation of bubbles and warpage can be suppressed.

According to at least one embodiment, the first resin substrate and the second resin substrate are flexible substrates, and the display panel is a flexible panel.

According to this structure, a flexible display can be realized in which substrate strength is improved and bubbles and warpage are suppressed.

According to at least one embodiment, the metal film includes one or more of stainless steel, aluminum, and copper.

According to this structure, substrate strength can be improved, and variations in temperature during the high temperature aging treatment can be suppressed.

A method according to an aspect of the present disclosure is a display panel manufacturing method including: forming light-emitting elements and a second resin substrate above a flexible substrate to form a light-emitting element substrate; attaching the light-emitting element substrate onto a first resin substrate to form a panel element; attaching an adhesive layer onto a metal film, where the adhesive layer includes contact portions in contact with the metal film and gaps are present between the contact portions where the adhesive layer is not in contact with the metal film; attaching the panel element onto the adhesive layer to form a flexible display panel; and applying a high temperature aging treatment to the flexible display panel.

According to this method, shape of the first resin substrate can be stabilized by the high temperature aging treatment while generation of bubbles in the first resin substrate and warpage of the display panel due to the high temperature aging treatment can be suppressed.

According to at least one embodiment of the method, the high temperature aging treatment is performed at 80° C. or greater for two hours or longer.

According to this method, outgassing from the first resin substrate and the adhesive layer after manufacture of the display panel can be suppressed, and residual stress can be removed from the display panel, stabilizing the shape of the display panel.

EMBODIMENTS

1. Schematic Structure of Display Panel

The following describes an organic EL display panel as one embodiment of a display panel pertaining to the present disclosure.

FIG. 1A is a schematic cross-section diagram of an organic EL display panel 1 pertaining to an embodiment. The following describes each element of the organic EL display panel 1.

<Base Resin Layer 10>

The base resin layer 10 is a flexible resin substrate that is a first layer of a flexible substrate. As a material of the base resin layer 10, a thermoplastic resin or a thermosetting resin may be used, for example, polyethylene terephthalate (PET) may be used. Further, polyimide (PI), polyetherimide (PEI), polysulfone (PSu), polycarbonate (PC), polyethylene naphthalate (PEN), polybutylene terephthalate, various styrene-based, polyolefin-based, polyurethane-based, etc., thermoplastic elastomers, epoxy resin, unsaturated polyester, silicone resin, polyurethane, or the like may be used, or a copolymer or blend composed primarily of one or more of the above may be used. The base resin layer 10 has a film thickness from 250 µm to 500 µm, for example. According to the present embodiment, the base resin layer 10 has a film thickness of 350 µm.

<First Adhesive Layer 20>

The first adhesive layer 20 is an adhesive layer for adhering the metal film 30 to the base resin layer 10. As a material of the first adhesive layer 20, a known pressure-sensitive adhesive can be used, such as acrylic polymer, rubber polymer, polyester polymer, urethane polymer, polyether polymer, silicone polymer, polyamide polymer, fluorine polymer, or the like.

<Metal Film 30>

The metal film 30 is a flexible metal film that is a second layer of the flexible substrate. As a material of the metal film 30, stainless steel, copper, aluminum, or the like may be used. The metal film 30 improves strength of the display panel 1. The metal film 30 is flexible, and therefore preferably has a film thickness of 200 μm or less, or 100 μm or less according to at least one embodiment. According to the present embodiment, the metal film 30 has a film thickness of 50 μm. Further, the metal film 30 may be provided with holes for outgassing from the base resin layer 10 and the first resin substrate 50.

<Second Adhesive Layer 40>

The second adhesive layer 40 is an adhesive layer for adhering the metal film 30 to the first resin substrate 50. FIG. 1B is a cross-section diagram of the second adhesive layer 40. Further, FIG. 1C is a plan view schematic diagram of the second adhesive layer 40 viewed from the metal film 30 side.

The second adhesive layer 40 has a substantially flat surface on the first resin substrate 50 side, and a degree of contact with the first resin substrate 50 is substantially uniform across the first resin substrate 50 side. On the other hand, the second adhesive layer 40 is not flat on the metal film 30 side. Only rectangular convex portions 40a contact the metal film 30, and grooved concave portions 40b do not contact the metal film 30. That is, at the convex portions 40a, the second adhesive layer 40 is in contact with both the first resin substrate 50 and the metal film 30, whereas at the concave portions 40b, the second adhesive layer 40 is in contact with only the first resin substrate 50 and is not in contact with the metal film 30. As a result, there is a gap where the second adhesive layer 40 and the metal film 30 are not in contact with each other along an interface between the second adhesive layer 40 and the metal film 30.

As a material of the second adhesive layer 40, a known pressure-sensitive adhesive can be used, such as acrylic polymer, rubber polymer, polyester polymer, urethane polymer, polyether polymer, silicone polymer, polyamide polymer, fluorine polymer, or the like.

The convex portions 40a do not necessarily each have a rectangular shape, and may each have a shape such as a hexagonal or circular shape. Further, the second adhesive layer 40 does not necessarily have to be made of a single material, and may have, for example, a three-layer structure of a layer of a plurality of pressure-sensitive adhesive columns, a flexible resin layer, and a continuous pressure-sensitive adhesive layer.

The second adhesive layer 40 and the first resin substrate 50 do not have to be in contact with each other over an entirety of their adjacent surfaces, and a gap may exist between the second adhesive layer 40 and the first resin substrate 50. However, a gap between the second adhesive layer 40 and the first resin substrate 50 is not necessary, and for improved adhesion a surface area of contact between the second adhesive layer 40 and the first resin substrate 50 is greater than a surface area of contact between the second adhesive layer 40 and the metal film 30.

<First Resin Substrate>

The first resin substrate 50 is a flexible resin substrate that is a third layer of the flexible substrate, and is a support substrate for the light-emitting element substrate 70. As a material of the first resin substrate 50, a thermoplastic resin or a thermosetting resin may be used, for example, polyethylene terephthalate (PET) may be used. Further, polyimide (PI), polyetherimide (PEI), polysulfone (PSu), polycarbonate (PC), polyethylene naphthalate (PEN), polybutylene terephthalate, various styrene-based, polyolefin-based, polyurethane-based, etc., thermoplastic elastomers, epoxy resin, unsaturated polyester, silicone resin, polyurethane, or the like may be used, or a copolymer or blend composed primarily of one or more of the above may be used. The first resin substrate 50 has a film thickness from 50 μm to 100 μm, for example. According to the present embodiment, film thickness of the first resin substrate 50 is 75 μm.

<Third Adhesive Layer>

The third adhesive layer 60 is an adhesive layer for adhering the first resin substrate 50 to the light-emitting element substrate 70. As a material of the third adhesive layer 60, a known pressure-sensitive adhesive can be used, such as acrylic polymer, rubber polymer, polyester polymer, urethane polymer, polyether polymer, silicone polymer, polyamide polymer, fluorine polymer, or the like.

<Light-Emitting Element Substrate>

The light-emitting element substrate 70 is a flexible resin substrate that is the fourth layer of the flexible substrate, and directly supports the light-emitting element layer 80. As a material of the light-emitting element substrate 70, a thermoplastic resin or a thermosetting resin may be used, for example, polyimide (PI) may be used. Further, polyetherimide (PEI), polysulfone (PSu), polycarbonate (PC), polyethylene terephthalate (PET), polyethylene naphthalate (PEN), polybutylene terephthalate, various styrene-based, polyolefin-based, polyurethane-based, etc., thermoplastic elastomers, epoxy resin, unsaturated polyester, silicone resin, polyurethane, or the like may be used, or a copolymer or blend composed primarily of one or more of the above may be used. The light-emitting element substrate 70 has a film thickness from 10 μm to 50 μm, for example. According to the present embodiment, the film thickness of the light-emitting element substrate 70 is 20 μm.

<Light-Emitting Element Layer>

The light-emitting element layer 80 is a layer made up of a plurality of light-emitting elements. More specifically, the light-emitting elements are arrayed in a matrix of rows and columns. The light-emitting elements may be any self-luminous elements, such as quantum dot light-emitting elements. Further, an arrangement of the light-emitting elements is not limited to the matrix of rows and columns, and, for example, if the light-emitting elements are hexagonal in shape in plan view, the light-emitting elements may be arranged in a honeycomb pattern.

<Polarizing Plate>

The polarizing plate 90 is a layer provided for adjusting light emitted from the light-emitting elements and suppressing reflection of external light inside the light-emitting elements. As a material of the polarizing plate 90, polyvinyl alcohol (PVA) in which iodine compound molecules are adsorbed and oriented may be used. The polarizing plate 90 may further include a layer made of triacetyl cellulose (TAC) or PET as a protective layer. The polarizing plate 90 has a film thickness from 100 μm to 300 μm, for example. According to the present embodiment, the film thickness of the polarizing plate 90 is 190 μm.

2. Schematic Structure of Light-Emitting Elements

The following describes organic EL elements in the light-emitting element layer 80.

FIG. 2 is a schematic cross-section diagram of the light-emitting element layer 80 according to the present embodiment. The light-emitting element layer 80 includes, for example, a plurality of pixels each composed of one of three colors of organic EL elements (red, green, and blue). In the light-emitting element layer 80, each organic EL element is a so-called top-emission type of light-emitting element that emits light forwards (towards the polarizing plate 90).

As illustrated in FIG. 2, organic EL elements are formed on the light-emitting layer substrate 70, and include a first sealing layer 811, a TFT layer 812, an interlayer insulating layer 820, pixel electrodes 831, banks 832, first functional layers 833, light-emitting layers 834, a second functional layer 835, a counter electrode 836, a sealing layer 837, and a fourth adhesive layer 840. The first sealing layer 811, the TFT layer 812, the interlayer insulating layer 820, the second functional layer 835, the counter electrode 836, the sealing layer 837, and the fourth adhesive layer 840 are not in one-to-one correspondence with pixels, and are common to a plurality of organic EL elements in the light-emitting element layer 80.

The following describes each element of an organic EL element.

<First Sealing Layer>

The first sealing layer 811 has a function of preventing impurities such as water and oxygen from entering the organic EL element from the light-emitting element substrate 70 side, and suppressing deterioration of these layers due to such impurities. As a material of the first sealing layer 811, silicon nitride (SiN) or silicon oxynitride (SiON) can be used.

<TFT Layer>

The TFT layer 812 is a circuit that drives each organic EL element, and a drive circuit is formed for each pixel.

<Interlayer Insulating Layer>

The interlayer insulating layer 820 is a resin layer formed on the first sealing layer 811 and the TFT layer 812, and planarizes irregularities in the TFT layer 812. As a material for the interlayer insulating layer 820, a positive photosensitive material can be used, for example.

<Pixel Electrodes>

Each of the pixel electrodes 831 includes a metal layer made of a light-reflecting metal material, and is formed on the interlayer insulating layer 820. One of the pixel electrodes 831 is provided per pixel, and the pixel electrodes 831 are electrically connected to the TFT layer 812 via contact holes.

According to the present embodiment, the pixel electrodes 831 function as anodes.

<Banks>

The banks 832 are formed on the pixel electrodes 831 so as to expose an area of each top surface of the pixel electrodes 831 and cover a periphery of each such area. In cross-section, the banks 832 each have a trapezoidal shape tapering upwards or an upwardly convex shape. The area of each top surface of the pixel electrodes 832 not covered by the banks 831 (also referred to as an "aperture") corresponds to a subpixel. That is, the banks 832 include apertures 832a corresponding one-to-one with subpixels. Where the pixel electrodes 831 are not present, the banks 832 are on the interlayer insulating layer 820. That is, where the pixel electrodes 831 are not present, bottom surfaces of the banks 832 are in contact with a top surface of the interlayer insulating layer 820.

The banks 832 function as a structure for preventing applied ink from coming into contact with ink of adjacent subpixels when the first functional layers 833 and/or the light-emitting layers 834 are formed by application of ink. Further, the banks 832 function as a structure for mounting a vapor deposition mask when the first functional layers 833 and/or the light-emitting layers 834 are formed by vapor deposition. If at least one of the first functional layers 833 and the light-emitting layer 834 are formed by ink application, preferably at least a top portion of each of the banks 832 is liquid-repellant.

<First Functional Layers>

The first functional layers 833 are provided for the purpose of promoting injection of carriers from the pixel electrodes 831 to the light-emitting layers 834. According to the present embodiment, the pixel electrodes 831 are anodes, and therefore each of the first functional layers 833 preferably has hole injection and transport properties and/or an electron blocking property.

<Light-Emitting Layers>

The light-emitting layers 834 are formed in the apertures 832a. The light-emitting layers 834 have a function of emitting red, green, blue (RGB) colors of light, due to recombination of holes and electrons. As a material of the light-emitting layers 834, a known material can be used.

According to the present embodiment, the light-emitting elements are organic EL elements, and therefore the light-emitting layers 834 are organic light-emitting materials, but materials having quantum dot light-emitting effects may be used as the light-emitting layers 834, and the light-emitting element layer 80 may be a quantum dot light-emitting element layer.

<Second Functional Layer>

The second functional layer 835 is provided for the purpose of promoting injection of carriers from the counter electrode 836 to the light-emitting layers 834. According to the present embodiment, the counter electrode 836 is a cathode, and therefore the second functional layer 835 preferably has electron injection and transport properties and/or a hole blocking property.

<Counter Electrode>

The counter electrode 836 is formed on the second functional layer 835, is common to a plurality of pixels, and functions as a cathode.

The counter electrode 836 is both light-transmissive and electrically conductive, and includes at least one of a metal layer formed from a metal material and a metal oxide layer formed from a metal oxide.

<Second Sealing Layer>

The second sealing layer 837 is disposed on the counter electrode 836. The second sealing layer 827 has a function of preventing impurities such as water and oxygen from entering the organic EL element from the polarizing plate 90 side, and suppressing deterioration of these layers due to such impurities. The second sealing layer 837 is formed from a light-transmissive material such as silicon nitride (SiN) or silicon oxynitride (SiON). Further, a sealing resin layer made of a resin material such as acrylic resin or epoxy resin may be provided on the layer made of a material such as silicon nitride (SiN) or silicon oxynitride (SiON).

According to the present embodiment, the organic EL elements are top-emission types light-emitting elements, and therefore the second sealing layer 837 is made of a light-transmissive material.

<Fourth Adhesive Layer>

The fourth adhesive layer 840 is an adhesive layer for adhering the second sealing layer 837 of the organic EL elements to the polarizing plate 90. As a material of the fourth adhesive layer 840, a known pressure-sensitive adhesive can be used, such as acrylic polymer, rubber polymer, polyester polymer, urethane polymer, polyether polymer, silicone polymer, polyamide polymer, fluorine polymer, or the like.

3. <Effects of Second Adhesive Layer>

The following describes effects of the second adhesive layer according to an embodiment, in comparison to a reference example, from the perspectives of suppressing bubble generation and preventing warpage.

<Effect of Suppressing Bubble Generation>

The following describes an effect of suppressing bubble generation, comparing structure of the second adhesive layer according to an embodiment and a reference example 1 of a continuous layer.

Figure 3A:
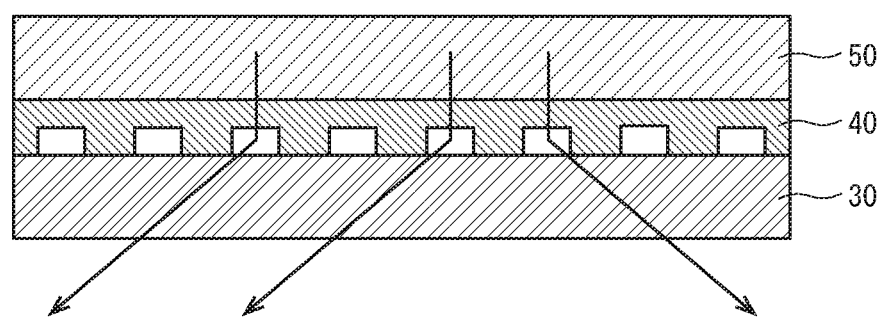
FIG. 3A is a schematic cross-section diagram of layers from a metal film 30 to a first resin substrate 50 according to an embodiment.
Figure 3B:
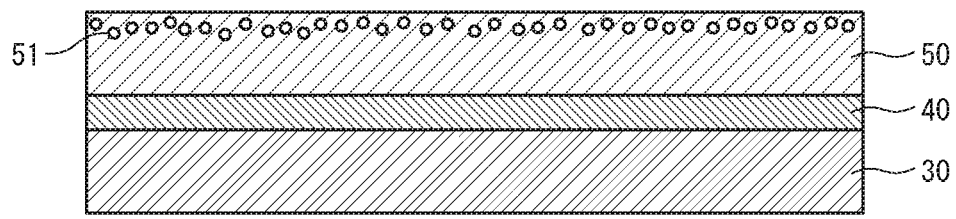
FIG. 3B is a schematic cross-section diagram of layers from the metal film 30 to the first resin substrate 50 of a reference example.

FIG. 3B is a schematic cross-section diagram of layers from the metal film 30 to the first resin substrate 50, in the reference example 1 in which the second adhesive layer 40 is replaced by an entire surface adhesive layer 41, which is a continuous layer made of the same material as the second adhesive layer 40. Here, continuous layer means a substantially flat film, and even when in close contact with other flat layers, there is no outgassing route at the interface between layers from a central portion of the continuous layer to outside through an outer edge thereof. In order make light-emitting element properties uniform, a "high temperature aging treatment" is performed at a temperature of 80° C. for several hours. However, when the high temperature aging treatment is applied to the structure of reference example 1, as illustrated in FIG. 3B, a large number of bubbles 51 are generated in the first resin substrate 50, at the interface between the first resin substrate 50 and the second adhesive layer 50, and elsewhere, causing a problem of a loss of flatness of a top surface of the first resin substrate 50.

On the other hand, FIG. 3A is a schematic cross-section diagram of layers from the metal film 30 to the first resin substrate 50 according to an embodiment of the present disclosure. As described above, the second adhesive layer 40 is not flat on the metal film 30 side. Only the convex portions 40a contact the metal film 30, and the concave portions 40b do not contact the metal film 30. That is, there are gaps where the second adhesive layer 40 and the metal film 30 are not in contact with each other along an interface between the second adhesive layer 40 and the metal film 30. When the high temperature aging treatment is applied to the structure of an embodiment as illustrated in FIG. 3A, the bubbles 51 are not generated, unlike the reference example 1.

The reasons for these results are described below.

In the high temperature aging treatment, water taken in by the first resin substrate 50 up to this point is released from the first resin substrate 50 as water vapor. However, the metal film 30 has low water permeability, and therefore the water of the first resin substrate 50 cannot be released from the metal film 30 side. Further, although not illustrated in FIG. 3A, 3B, the first sealing layer 811, which is water resistant, is above the light-emitting element substrate 70, and therefore water of the first resin substrate 50 cannot be released from the light-emitting element substrate 70 side. Accordingly, in the case of the reference example 1, it is thought that water desorption paths from the first resin substrate 50 to outside the display panel are insufficient, and bubbles are generated due to evaporation of water inside the first resin substrate 50.

In contrast, according to the present embodiment and as described above, gaps are present where the second adhesive layer 40 is not in contact with the metal film 30, and along the interface between the second adhesive layer 40 and the metal film 30 are areas where the second adhesive layer 40 is not in contact with the metal film 30. Accordingly, water desorption paths exist by which water of the first resin substrate 50 passes through the second adhesive layer 40, and from gaps between the second adhesive layer 40 and the metal film 30 to outside the display panel 1. Accordingly, bubbles are not generated at the interface between the second adhesive layer 40 and the metal film 30.

<Warp Suppression Effects>

The following describes an effect of warp suppression, comparing structure of the second adhesive layer according to an embodiment to a reference example.

Table 1 below illustrates a degree of warpage (large or small) after high temperature aging treatment for the second adhesive layer 40 between the metal film 30 and the first resin substrate 50 and the third adhesive layer 60 between the first resin substrate 50 and the light-emitting element substrate 70, for the structure of an embodiment, a structure in which a facing along a z-axis direction of the second adhesive layer 40 is reversed, and structures in which each of these examples of the second adhesive layer 40 are swapped with the third adhesive layer 60. The manufactured display panels were allowed to cool at room temperature for 15 minutes or longer, standing on a horizontal surface plate so a central portion of the display panel was in contact with the surface plate and edges thereof were not in contact with the surface plate. Vertical distances from the surface plate to a central portion of each outer edge of a lower surface of each display panel were measured, and average values for each display panel were calculated to indicate warpage after the high temperature aging treatment.

TABLE 1

| | | Embodiment | Reference example 2 | Reference example 3 | Reference example 4 |
|---|---|---|---|---|---|
| Second adhesive layer | Metal film side | Gaps | Flat | Flat | Flat |
| | First resin substrate side | Flat | Gaps | Flat | Flat |
| Third adhesive layer | First resin substrate side | Flat | Flat | Gaps | Flat |
| | Light-emitting element substrate side | Flat | Flat | Flat | Gaps |
| Bubbles | | No | No | No | No |
| Warping | | Small | Large | Large | Large |

"Gaps" as indicated in Table 1 indicates that gaps similar to the gaps described between the metal film 30 and the second adhesive layer 40 are present between the adhesive layer and the substrate or metal film. Further, "flat" means that there is no gap between the adhesive layer and the substrate or metal film, or that any gap is sufficiently narrower than when "gaps" is indicated. Further, in Table 1, "small" warpage indicates suppression of warpage in comparison to the reference example 1 in which the second adhesive layer 40 is replaced by the entire surface adhesive layer 41, which is a continuous layer made of the same material as the second adhesive layer 40, and "large" warpage indicates more warpage than that of the reference example 1.

As indicated in Table 1, bubbles were not generated in any of the structures. The reason for this is thought to be because water can escape from the gaps, as described above.

On the other hand, an amount of warpage was smaller for the embodiment than for the reference examples. More specifically, a degree of warpage for the embodiment was suppressed to approximately 0.6 that of reference example 1. Further, a degree of warpage for the embodiment was suppressed to approximately 0.8 that of reference example 2.

The reason for this is described below.

Figure 4A:
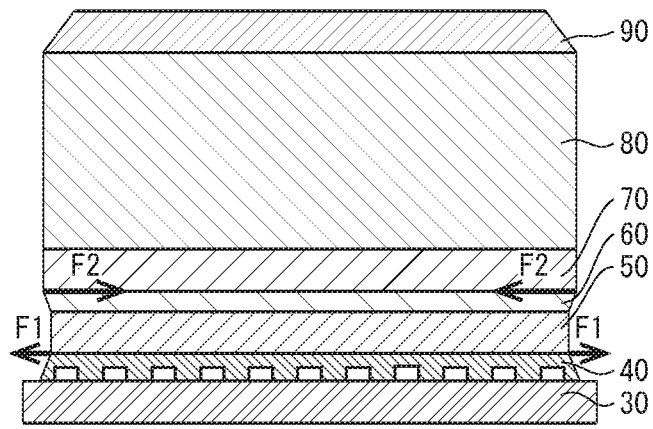
Figure 4B:
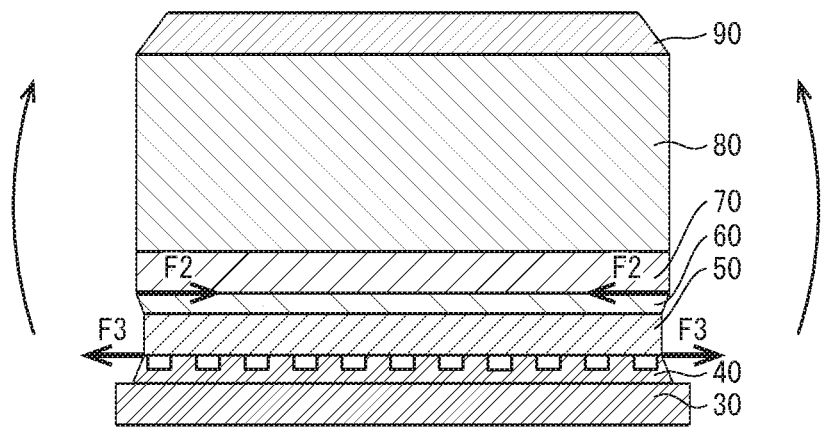
FIG. 4B and FIG. 4C are schematic cross-section diagrams illustrating stress states after high temperature aging treatment of display panels according to reference examples.
Figure 4C:
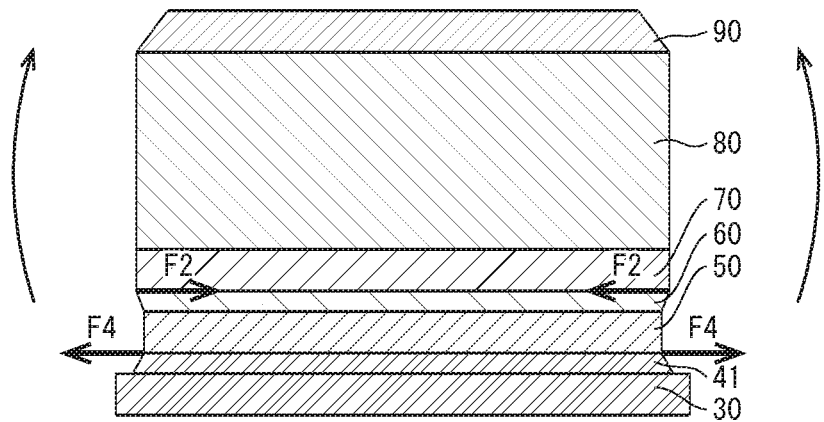

FIG. 4C is a schematic cross-section diagram of layers from the metal film 30 to the polarizing plate 90 according to reference example 1, in which the entire surface adhesive layer 41 made of the same material as the second adhesive layer 40 is used in place of the second adhesive layer 40. Here, the first resin substrate 50, the light-emitting element substrate 70, and the polarizing plate 90 are all resin layers, and therefore it is considered that volume is reduced due to desorption of water when the high temperature aging treatment is applied. In contrast, it is considered that volume of the metal film 30 increases due to thermal expansion during the high temperature aging treatment then returns to its original volume when display panel temperature returns to room temperature after completion of the high temperature aging treatment. Due to the differences in volume changes, warping occurs such that the metal film 30 side becomes an outer side and the polarizing plate 90 side becomes an inner side of a curvature.

In contrast, according to the embodiment illustrated in FIG. 4A, gaps exist at the interface between the second adhesive layer 40 and the metal film 30 where the second adhesive layer 40 is not in contact with the metal film 30. Accordingly, it is thought that the presence of the gaps ameliorates the differences in changes of volumes of the resin layers and the metal film, suppressing warpage.

According to the reference example 2 illustrated in FIG. 3B, a positional relationship between the gaps, the resin layer, and the metal film is different from that of the present embodiment, and therefore it is thought that the changes in volume between the resin layers and the metal film are insufficiently ameliorated by the gaps, and the effect of suppressing warpage is insufficient.

According to the reference examples 3 and 4 illustrated in Table 1, positional relationships between the gaps, the resin layers, and the metal films are also different, and therefore it is thought that the changes in volume between the resin layers and the metal films are insufficiently ameliorated by the gaps, and the effect of suppressing warpage is insufficient. In other words, it is thought that it is necessary that the gaps exist to ameliorate the differences in volume changes between the resin layers and the metal film caused by the high temperature aging treatment, and an example arrangement of the gaps that realizes this effect is the embodiment.

According to the present embodiment, PET is used as a material of the first resin substrate 50, which is a water-absorbing material having a water absorption rate of 0.3%, but warpage is suppressed when using this material. Thus, according to a display panel pertaining to an embodiment, a material having a high water absorption rate can be used as a material of the first resin substrate, and even when a material with a water absorption rate of 0.1% or more is used, warpage can be suppressed.

4. Review

As described above, according to a display panel pertaining to at least one embodiment, generation of bubbles and warpage when the high temperature aging treatment is applied can be suppressed. Accordingly, high-quality display panel having excellent flatness can be manufactured. Further, according to the structure described above, generation of bubbles and warpage can be suppressed even if a material having a water absorption rate of 0.1% or more is used as a material of the first resin substrate. Thus, a range of materials that can be selected for the first resin substrate can be expanded, and a material having a high water absorption rate can be used as long as the material is suitable as a flexible substrate of a display panel.

5. Display Panel Manufacturing Method

The following describes a method of manufacturing an organic EL display panel as a method of manufacturing a display panel according to an embodiment of the present disclosure. FIG. 6A to FIG. 10B are schematic cross section diagrams illustrating states in the manufacture of the organic EL display panel 1. Further, FIG. 5 is a flowchart illustrating the method for manufacturing the organic EL display panel 1.

(1) Attachment of Base Resin Layer 10 to Metal Film 30

Figure 6A:
FIG. 6A, 6B, 6C, 6D are cross-section diagrams schematically illustrating an organic EL display panel manufacturing process according to an embodiment, where
Figure 6B:
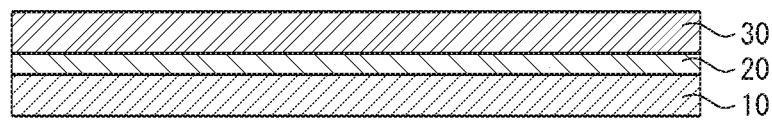

First, as illustrated in FIG. 6A, the base resin layer 10 is prepared (step S10). Next, the first adhesive layer 20 is formed on the base resin layer 10, and the metal film 30 is attached to the first adhesive layer 20 (step S20, FIG. 6B). The first adhesive layer 20 may be formed by a method of applying material of the first adhesive layer 20 on the base resin layer 10, or by attaching the first adhesive layer 20 already formed in a film shape onto the base resin layer 10.

(2) Attachment of Second Adhesive Layer 40

Figure 6C:
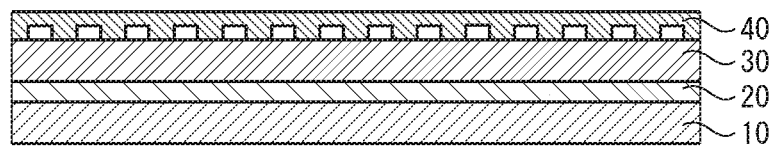

Next, as illustrated in FIG. 6C, the second adhesive layer 40 is attached to the metal film 30 (step S30). More specifically, the second adhesive layer 40 already formed in a film shape is attached to the metal film 30.

(3) Attachment of First Resin Substrate 50

Figure 6D:
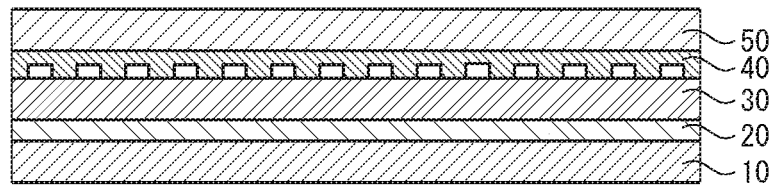

Next, as illustrated in FIG. 6D, the first resin substrate 50 is attached to the second adhesive layer 40 (step S40).

(4) Attachment of Light-Emitting Element Substrate 70 to the Holding Substrate 100

Figure 7A:
FIG. 7A, 7B, 7C, 7D are cross-section diagrams schematically illustrating an organic EL display panel manufacturing process according to an embodiment, where

Next, as illustrated in FIG. 7A, the light-emitting element substrate 70 is attached to the holding substrate 100 (step S50). The holding substrate 100 can be a rigid substrate such as a glass substrate, for example. The holding substrate 100 is preferably a light-transmissive substrate when using laser light in step S210, as described later. Attachment of the light-emitting element substrate 70 can be achieved by, for example, applying a material of the light-emitting element substrate 70 onto the holding substrate 100 by a spin coating method or the like.

(5) Forming Light-Emitting Elements on Light-Emitting Element Substrate 70

Figure 11:
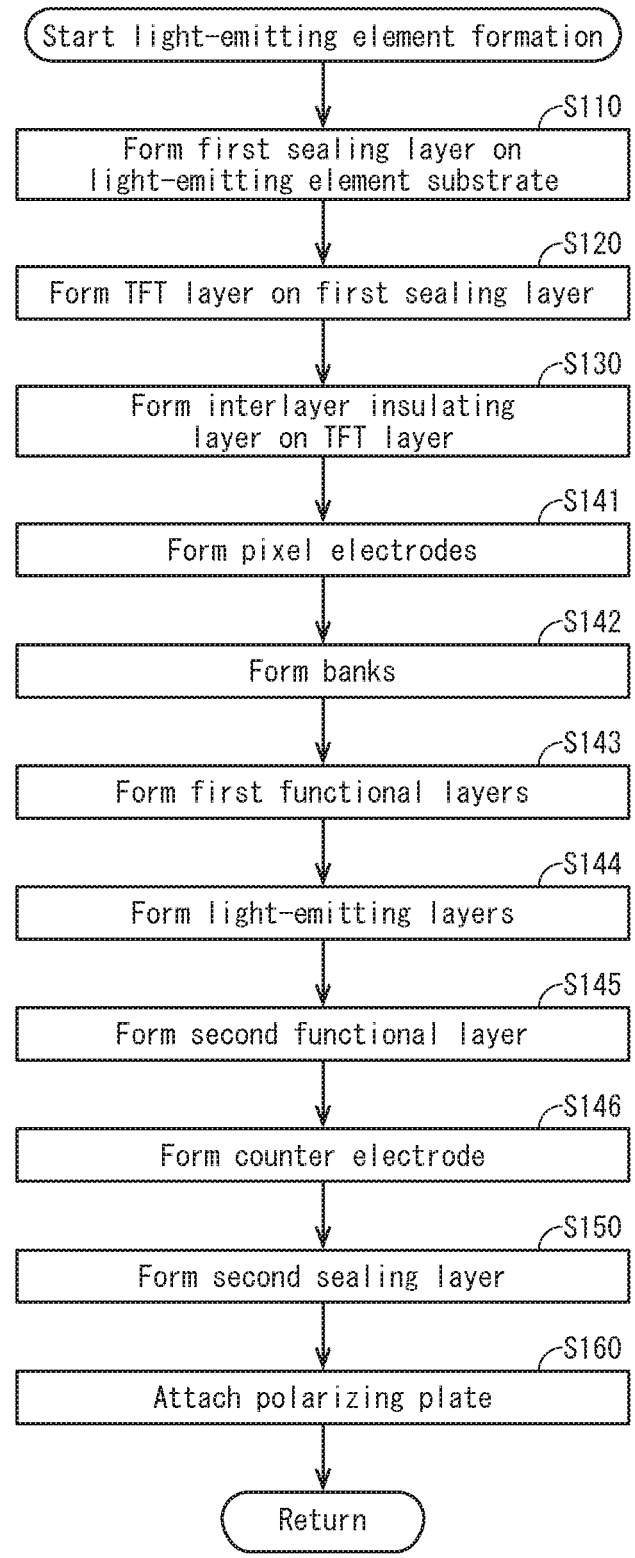
FIG. 11 is a flowchart illustrating an organic EL element manufacturing process as a portion of an organic EL display panel manufacturing process according to an embodiment.

Next, organic EL elements, which are light-emitting elements, are formed on the light-emitting element substrate 70 (step S100). FIG. 11 is a flowchart illustrating an organic EL element manufacturing method.

(i) Forming First Sealing Layer 811

Figure 7B:
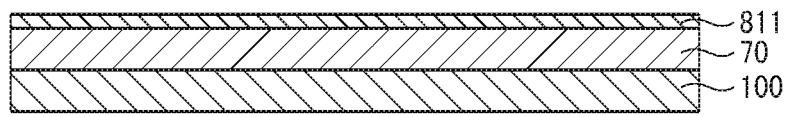

First, as illustrated in FIG. 7B, the first sealing layer 811 is formed on the light-emitting element substrate 70 (step S110). The first sealing layer 811 is formed as a uniform film on the light-emitting element substrate 70 by a method such as chemical vapor deposition (CVD) or sputtering.

(ii) Forming TFT Layer 812, Interlayer Insulating Layer 820

Next, the TFT layer 812 is formed on the first sealing layer 811 (step S120). The TFT layer 812 can be formed by a known TFT manufacturing method.

Figure 7C:
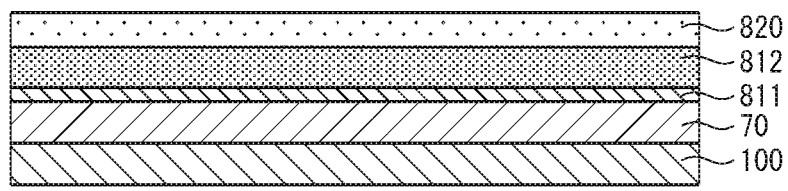

Next, the interlayer insulating layer 820 is formed on the TFT layer 812 (FIG. 7C, step S130). The interlayer insulating layer 820 can be formed by lamination using, for example, plasma CVD, sputtering, or the like.

Next, dry etching of the interlayer insulating layer 820 is performed in locations above source electrodes in the TFT layer 812, forming contact holes. The contact holes are formed so that bottoms of the contacts holes each expose a surface of a source electrode.

Next, a connecting electrode layer is formed following inner walls of the contact holes. An upper portion of the connecting electrode layer is disposed above the interlayer insulating layer 812. Forming the connecting electrode layer can be achieved by using a sputtering method, for example, and after a metal film is formed, patterning by using a photolithography method and a wet etching method.

(iii) Forming Pixel Electrodes 831

Figure 7D:
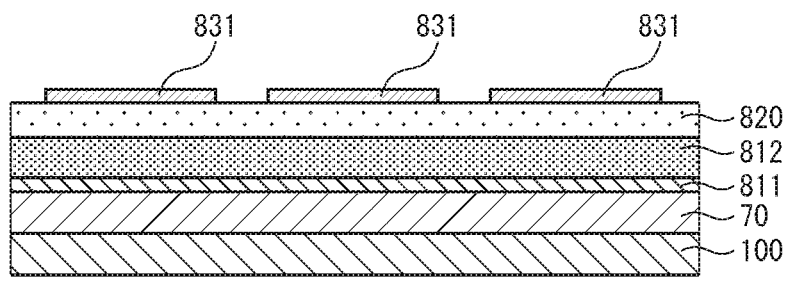

Next, as illustrated in FIG. 7D, the pixel electrodes 831 are formed on the interlayer insulating layer 812 (step S141). The pixel electrodes 831 are formed, for example, by forming a uniform film on the interlayer insulating layer 812 of a material of the pixel electrodes 831 by using a method such as vacuum deposition or sputtering, then patterning the material by photolithography and etching.

(iv) Forming Banks 832

Figure 8A:
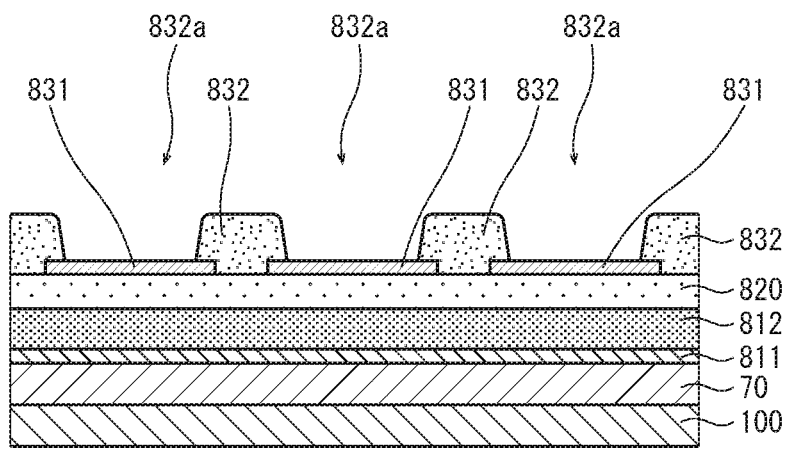
FIG. 8A, 8B, 8C are cross-section diagrams schematically illustrating an organic EL display panel manufacturing process according to an embodiment, where

Next, as illustrated in FIG. 8A, the banks 832 are formed at least in intervals between the pixel electrodes 831 on the interlayer insulating layer 812 (step S142). The banks 832 are formed, for example, by uniform application by a spin coating method of a solution in which a phenol resin, which is a photosensitive material, is dissolved in solvent, then patterned by pattern exposure and development.

(v) Forming First Functional Layers 833

Figure 8B:
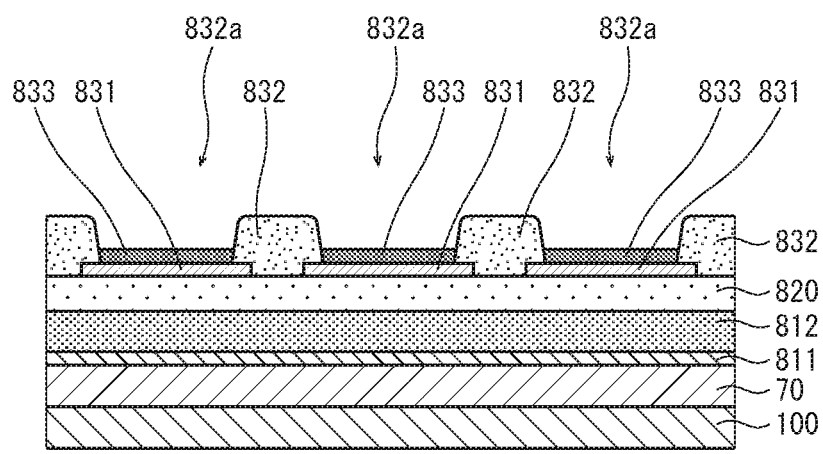

Next, as illustrated in FIG. 8B, the first functional layers 833 are formed on the pixel electrodes 831 in the apertures 832a between the banks 832 (step S143). Formation of the first functional layers 833 is achieved by, for example, applying an ink containing a material of the first functional layers 833 from nozzles of an inkjet head, then baking (drying) the ink. Alternatively, formation of the first functional layers 833 may be achieved by, for example, placing a vapor-deposition mask on the banks 832 to correspond to the apertures 832a, and film forming by vacuum deposition, physical vapor deposition (PVD), CVD, or the like of material of the first functional layers 833. In a case where the first functional layers 833 each have a multilayer structure, all layers may be formed by an application method, all layers may be formed by a vapor deposition method, and a portion of the layers may be formed by an application method and a remainder by a vapor deposition method.

(vi) Forming Light-Emitting Layers 834

Figure 8C:
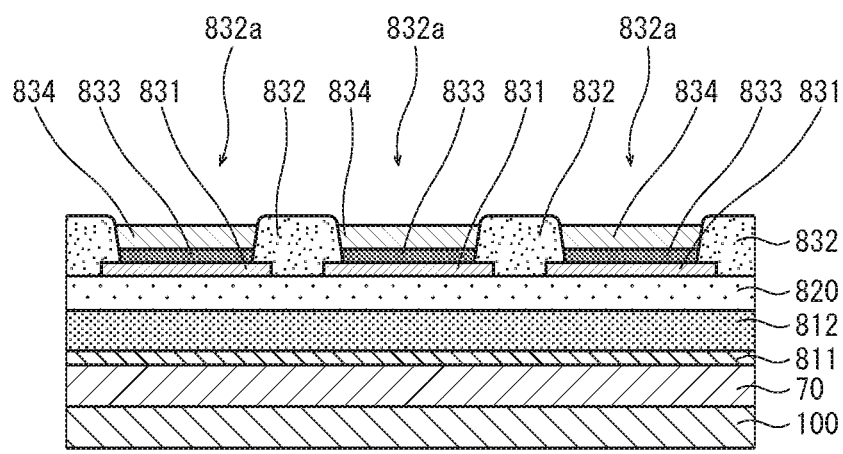

Next, as illustrated in FIG. 8C, the light-emitting layers 834 are formed on the first functional layers 833 in the apertures 832a between the banks 832 (step S144). Formation of the light-emitting layers 834 is achieved by, for example, applying an ink containing a material of the light-emitting layers 834 from nozzles of an inkjet head, then baking (drying) the ink. Alternatively, formation of the light-emitting layers 834 may be achieved by, for example, placing a vapor-deposition mask on the banks 832 to correspond to the apertures 832a, and film forming by vacuum deposition, PVD, CVD, or the like of material of the light-emitting layers 834.

(vii) Forming Second Functional Layer 835

Figure 9A:
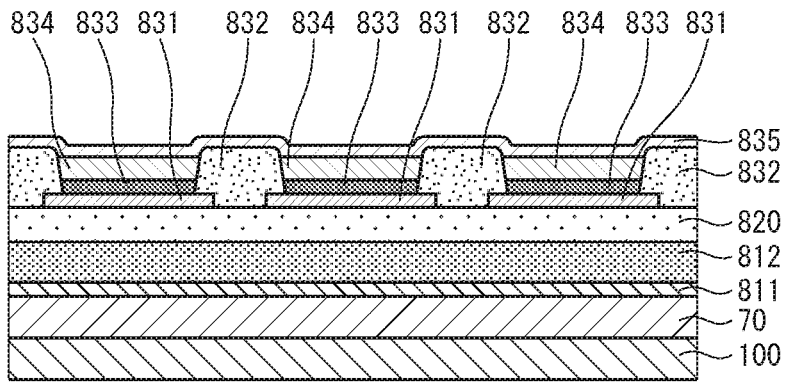
FIG. 9A, 9B, 9C are cross-section diagrams schematically illustrating an organic EL display panel manufacturing process according to an embodiment, where

Next, as illustrated in FIG. 9A, the second functional layer 835 is formed on the light-emitting layers 834 and the banks 832 (step S145). Formation of the second functional layer 835 is achieved by, for example, film forming by vacuum deposition, PVD, CVD, or the like of material of the second functional layer 835.

(viii) Forming Counter Electrode 836

Figure 9B:
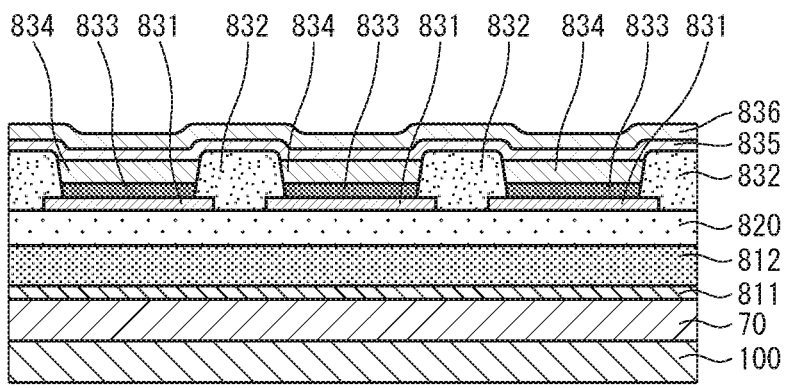

Next, as illustrated in FIG. 9B, the counter electrode 836 is formed on the second functional layer 835 (step S146). Formation of the counter electrode 836 is achieved by, for example, film forming by vacuum deposition, sputtering, or the like of material of the counter electrode 836.

(ix) Forming Second Sealing Layer 837

Figure 9C:
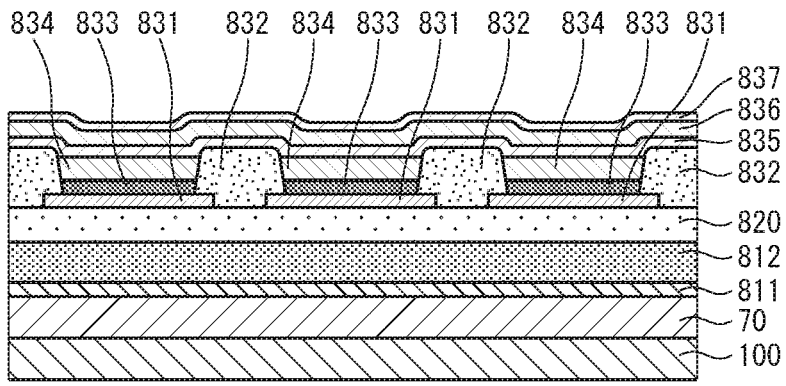

Next, as illustrated in FIG. 9C, the second sealing layer 837 is formed on the counter electrode 836 (step S150). Formation of the second sealing layer 837 is achieved by, for example, CVD, sputtering, or the like of material of the second sealing layer 837.

(x) Attaching Polarizing Plate 90

Figure 10A:
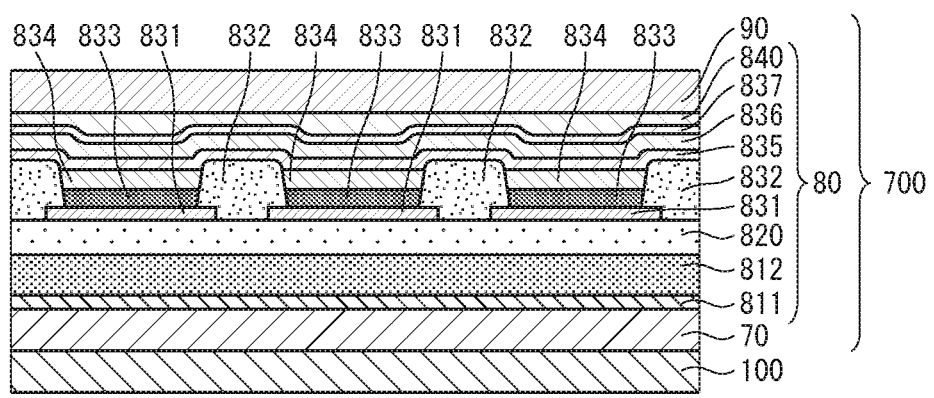
FIGS. 10A and 10B are cross-section diagrams schematically illustrating an organic EL manufacturing process according to an embodiment, where

Next, as illustrated in FIG. 10A, the polarizing plate 90 is attached via the fourth adhesive layer 840 onto the second sealing layer 837 (step S160). More specifically, for example, a dispenser applies material of the fourth adhesive layer 840 onto the second sealing layer 837, and the polarizing plate 90, which is previously-formed and sheet-shaped, is attached.

The organic EL elements are thus completed.

The following continues the description of the display panel manufacturing method, returning to FIG. 5.

(6) Separation of Light-Emitting Element Substrate 70 from Holding Substrate 100

Next, the light-emitting element substrate 70 is separated from the holding substrate 100, thereby separating a light-emitting element unit 700 including the light-emitting element substrate 70, the light-emitting element layer 80, and the polarizing plate 90 from the holding substrate 100 (step S210). Separation of the light-emitting element substrate 70 is achieved, for example, if the holding substrate 100 is a glass substrate, by irradiating an interface of the light-emitting element substrate 70 with the holding substrate 100 with a laser from below, through the holding substrate 100.

(7) Attaching Light-Emitting Element Unit 700 on First Resin Substrate 50

Figure 10B:
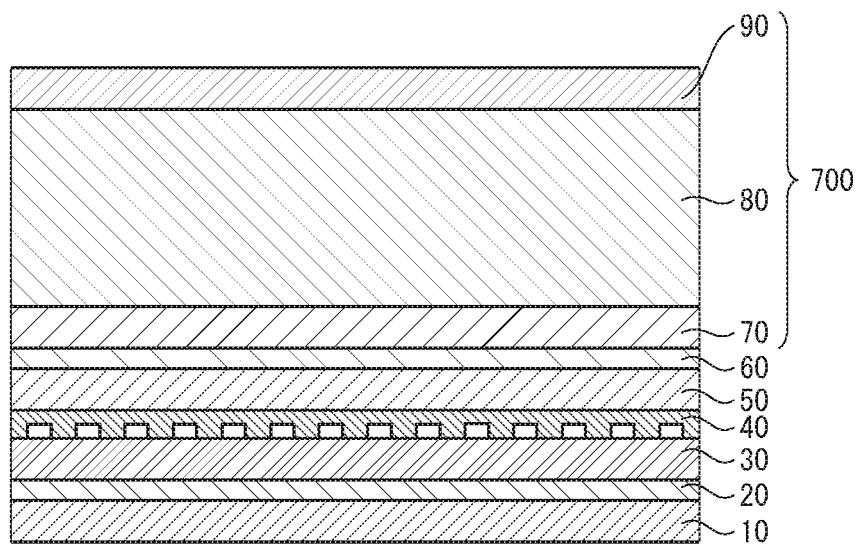

Next, as illustrated in FIG. 6D, the light-emitting element unit 700 is attached to a laminated structure of layers from the base resin layer 10 to the first resin substrate 50 (FIG. 10B, step S220). More specifically, the third adhesive layer 60 is formed on the first resin substrate 50, and the light-emitting element unit 700 is attached onto the third adhesive layer 60. Formation of the third adhesive layer 60 may be achieved by applying material of the third adhesive layer 60 onto the first resin substrate 50, and may be achieved by attaching the third adhesive layer 60 in a pre-formed sheet shape onto the first resin substrate 50.

(8) High Temperature Aging

Finally, the display panel formed in step S220 is subjected to a high temperature aging treatment (step S230), which is, for example, set to 80° C. for 2 hours.

Through the processes described above, the display panel 1 is completed.

As described above, layers from the light-emitting element substrate 70 of step S50 onwards are formed after forming layers up to the first resin substrate 50 of step S40, but steps up to the forming of the first resin substrate 50 of step S40 may be performed in parallel with steps from step S50 to step S210, until the light-emitting element substrate 70 is separated from the holding substrate 100, and then the light-emitting element unit 700 is attached onto the first resin substrate 50.

6. Supplement (1) According to at least one embodiment, the light-emitting element substrate 70 is attached to a laminated structure including the base resin layer 10, the metal film 30, and the first resin substrate 50, but the laminated structure is not limited to this. For example, the laminated structure may include the metal film 30 and the first resin substrate 50 without the base resin layer 10, or the laminated structure may include a plurality of metal films.

(2) According to at least one embodiment, the first adhesive layer 20 that adheres the base resin layer 10 to the metal film 30 has a structure in which both surfaces are continuous, but, like the second adhesive layer 40, a structure may be used in which gaps are present on the metal film 30 side of the first adhesive layer 20. Such a structure can help suppress generation of bubbles in the base resin layer 10.

(3) According to at least one embodiment, the polarizing plate 90 is provided on the light-emitting element layer 80, but color filter layer may be added on the polarizing plate 90.

(4) According to at least one embodiment, the display panel 1 is a flexible display panel, but the display panel 1 is not limited to this. The display panel 1 need not be flexible, as long as it has a substrate with a laminated structure including a resin layer and a metal layer.

(5) According to at least one embodiment, an ink-application type of organic EL display panel is described as an example display panel, but the display panel may be, for example, a vapor deposition type of organic EL display panel, or another type of self-luminous panel. Further, the display panel is not limited to being a top-emission type of display panel, and may be a bottom-emission type or a light-transmissive liquid crystal display panel.

(6) Display panels and display panel manufacturing methods pertaining to the present disclosure have been described based on embodiments and modifications, but the present disclosure is not limited to the embodiments and modifications described.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. A display panel comprising:
a metal film;
an adhesive layer disposed on the metal film;
a first resin substrate disposed on the adhesive layer;
light emitting elements disposed above the first resin substrate; and
a second resin substrate disposed above the light-emitting elements, wherein
the adhesive layer includes contact portions in contact with the metal film and gaps are present between the contact portions where the adhesive layer is not in contact with the metal film.

2. The display panel of claim 1, wherein
a surface area where the adhesive layer is in contact with the first resin substrate is greater than a total surface area where the contact portions are in contact with the metal film.

3. The display panel of claim 1, wherein
the adhesive layer comprises:
a first adhesive layer in contact with the first resin substrate; and
a second adhesive layer composed of the contact portions.

4. The display panel of claim 1, wherein
the second resin substrate is a polarizing plate.

5. The display panel of claim 1, wherein
a water absorption rate of a material of the first resin substrate is 0.3%.

6. The display panel of claim 1, wherein
a material of the first resin substrate is polyethylene terephthalate.

7. The display panel of claim 1, wherein
the first resin substrate and the second resin substrate are flexible substrates, and
the display panel is a flexible panel.

8. The display panel of claim 1, wherein
the metal film includes one or more of stainless steel, aluminum, and copper.

9. A display panel manufacturing method comprising:
forming light-emitting elements and a second resin substrate above a flexible substrate to form a light-emitting element substrate;
attaching the light-emitting element substrate onto a first resin substrate to form a panel element;
attaching an adhesive layer onto a metal film, where the adhesive layer includes contact portions in contact with the metal film and gaps are present between the contact portions where the adhesive layer is not in contact with the metal film;
attaching the panel element onto the adhesive layer to form a flexible display panel; and
applying a temperature treatment to the flexible display panel.

* * * * *